(12) United States Patent
Lee

(10) Patent No.: US 9,508,657 B2
(45) Date of Patent: Nov. 29, 2016

(54) SEMICONDUCTOR PACKAGE

(71) Applicant: SAMSUNG ELECTRONICS CO., LTD., Suwon-si, Gyeonggi-do (KR)

(72) Inventor: Seok-Hyun Lee, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/698,353

(22) Filed: Apr. 28, 2015

(65) Prior Publication Data

US 2015/0380361 A1 Dec. 31, 2015

(30) Foreign Application Priority Data

Jun. 26, 2014 (KR) ........................ 10-2014-0078944

(51) Int. Cl.
*H01L 23/552* (2006.01)
*H01L 23/00* (2006.01)
*H01L 21/56* (2006.01)
*H01L 23/31* (2006.01)

(52) U.S. Cl.
CPC .......... *H01L 23/552* (2013.01); *H01L 21/561* (2013.01); *H01L 24/97* (2013.01); *H01L 23/3128* (2013.01); *H01L 24/16* (2013.01); *H01L 24/32* (2013.01); *H01L 24/48* (2013.01); *H01L 24/73* (2013.01); *H01L 2224/0401* (2013.01); *H01L 2224/04042* (2013.01); *H01L 2224/16227* (2013.01); *H01L 2224/32225* (2013.01); *H01L 2224/32245* (2013.01); *H01L 2224/48091* (2013.01); *H01L 2224/48227* (2013.01); *H01L 2224/73204* (2013.01); *H01L 2224/73265* (2013.01); *H01L 2224/97* (2013.01); *H01L 2225/1058* (2013.01); *H01L 2924/15156* (2013.01); *H01L 2924/15311* (2013.01); *H01L 2924/181* (2013.01)

(58) Field of Classification Search
CPC .... H01L 23/552; H01L 21/561; H01L 24/97
USPC ........................................................ 257/659
See application file for complete search history.

(56) References Cited

U.S. PATENT DOCUMENTS

| 5,448,106 | A | 9/1995 | Fujitsu | |
|---|---|---|---|---|
| 5,557,142 | A * | 9/1996 | Gilmore | ................ H01L 23/552 174/521 |
| 5,864,088 | A | 1/1999 | Sato et al. | |
| 7,498,907 | B2 * | 3/2009 | Suzuki | .................. H01L 23/552 333/12 |
| 7,639,513 | B2 | 12/2009 | Otsuki | |
| 7,692,288 | B2 | 4/2010 | Zhe et al. | |

(Continued)

FOREIGN PATENT DOCUMENTS

| JP | 10284873 | 10/1998 |
|---|---|---|
| JP | 2001160605 | 6/2001 |

(Continued)

*Primary Examiner* — Luan C Thai
(74) *Attorney, Agent, or Firm* — F. Chau & Associates, LLC

(57) ABSTRACT

A semiconductor device is provided. The semiconductor includes a semiconductor chip, a package substrate, and an electromagnetic interference (EMI) shielding layer. The package substrate, arranged under the semiconductor chip, is electrically connected to the semiconductor chip. The package substrate has a receiving groove. The EMI shielding layer is arranged in the receiving groove to shield EMI propagated from a lower surface of the semiconductor chip through the package substrate.

13 Claims, 17 Drawing Sheets

(56) References Cited

U.S. PATENT DOCUMENTS

| | | | |
|---|---|---|---|
| 8,368,209 B2 | 2/2013 | Tuji et al. | |
| 8,466,539 B2 * | 6/2013 | Li | H01L 23/552 257/422 |
| 8,829,667 B2 * | 9/2014 | Park | H01L 23/552 257/659 |
| 2007/0045829 A1 | 3/2007 | Jeong et al. | |
| 2014/0021591 A1 * | 1/2014 | Sung | H01L 23/60 257/659 |
| 2014/0048913 A1 | 2/2014 | Park et al. | |
| 2014/0291527 A1 * | 10/2014 | Okudo | G01J 1/0407 250/353 |

FOREIGN PATENT DOCUMENTS

| | | |
|---|---|---|
| JP | 2012253190 | 12/2012 |
| JP | 2013098200 | 5/2013 |
| KR | 1020070012963 | 1/2007 |
| KR | 1020100070487 | 6/2010 |

* cited by examiner

US 9,508,657 B2

SEMICONDUCTOR PACKAGE

CROSS-REFERENCE TO RELATED APPLICATION

This application claims priority under 35 U.S.C. §119 to Korean Patent Application No. 10-2014-0078944, filed on Jun. 26, 2014 in the Korean intellectual Property Office, the disclosure of which is incorporated by reference herein in its entirety.

TECHNICAL FIELD

The present inventive concept relates to a semiconductor package.

DISCUSSION OF RELATED ART

Various semiconductor chips are closely packed in a mobile electronic device. Electrical circuits of each semiconductor chip may be affected due to electromagnetic radiation or electromagnetic induction emitted from other semiconductor chips. Such disturbance may cause the mobile electronic device to malfunction. In addition, such disturbance may affect or degrade the signal qualities that the mobile electronic device receives from an outer signal source.

SUMMARY

According to an exemplary embodiment of the present inventive concept, a semiconductor device is provided. The semiconductor includes a semiconductor chip, a package substrate, and an electromagnetic interference (EMI) shielding layer. The package substrate, arranged under the semiconductor chip, is electrically connected to the semiconductor chip. The package substrate has a receiving groove. The EMI shielding layer is arranged in the receiving groove to shield EMI propagated from a lower surface of the semiconductor chip through the package substrate.

According to an exemplary embodiment of the present inventive concept, a semiconductor device is provided. The semiconductor includes a semiconductor chip, a package substrate, an EMI shielding can, and an EMI shielding layer. The package substrate, arranged under the semiconductor chip, is electrically connected to the semiconductor chip. The package substrate has a protrusion protruded toward the semiconductor chip to form a receiving groove. The EMI shielding can covers the package substrate and the semiconductor chip to shield EMI propagated from an upper surface and side surfaces of the semiconductor chip. The EMI shielding layer is arranged in the receiving groove to shield EMI propagated from a lower surface of the semiconductor chip through the package substrate.

According to an exemplary embodiment of the present inventive concept, a semiconductor device is provided. A first semiconductor package includes a first semiconductor device, a first EMI shielding layer and a first ground line which is electrically connected to the first EMI shielding layer. The first EMI shielding layer covers a top surface and a side wall of the first semiconductor device. A second semiconductor package is stacked on the first semiconductor package. The semiconductor package includes a second semiconductor device, a second EMI shielding layer and a second ground line which is electrically connected to the second EMI shielding layer. The second EMI faces a bottom surface of the second semiconductor device. An area of the second EMI shielding layer is greater than an area of the second semiconductor device. The first EMI shielding layer and the second shielding layer is interposed between the first semiconductor device and the second semiconductor device.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
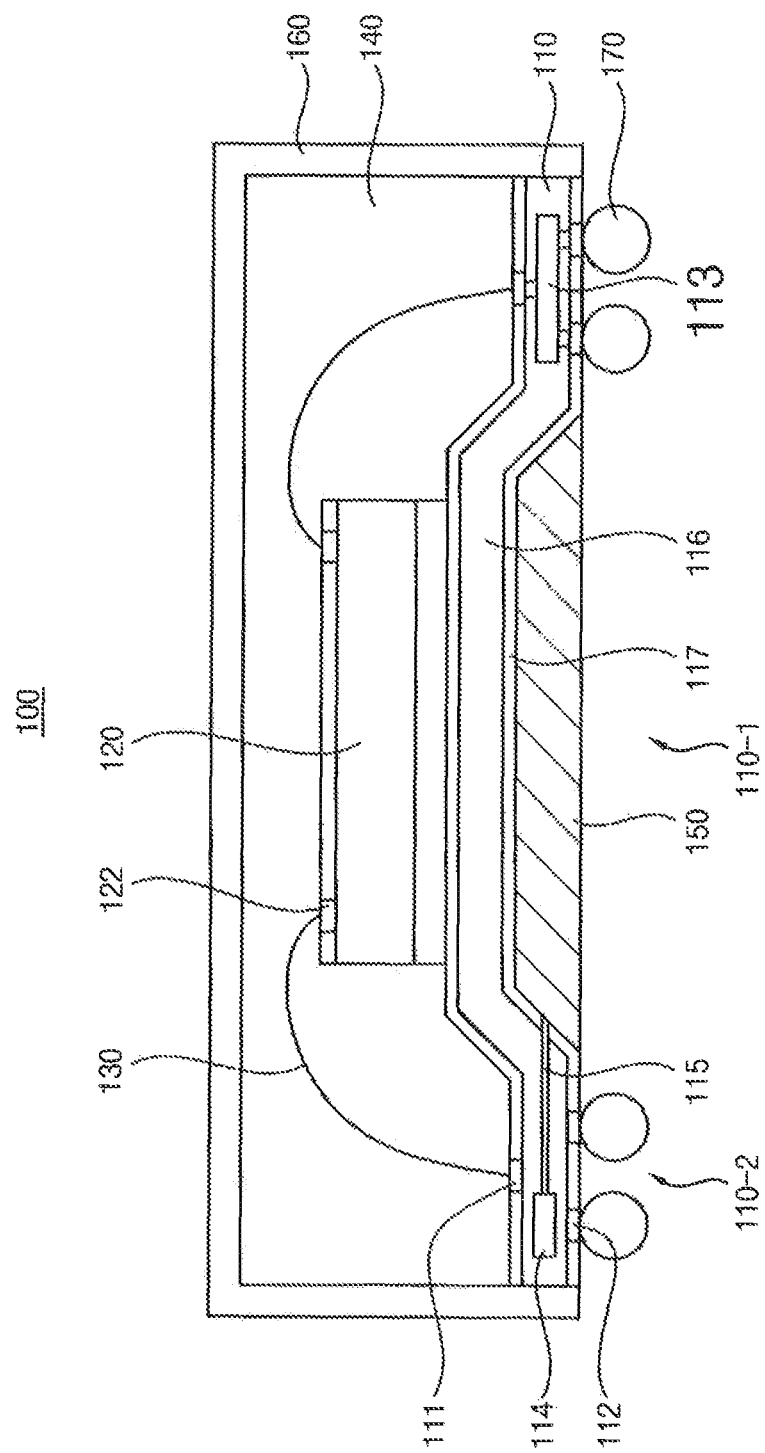
FIG. 1 is a cross-sectional view illustrating a semiconductor package in accordance with an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinafter, exemplary embodiments will be described with reference to the accompanying drawings.

Figure 2:
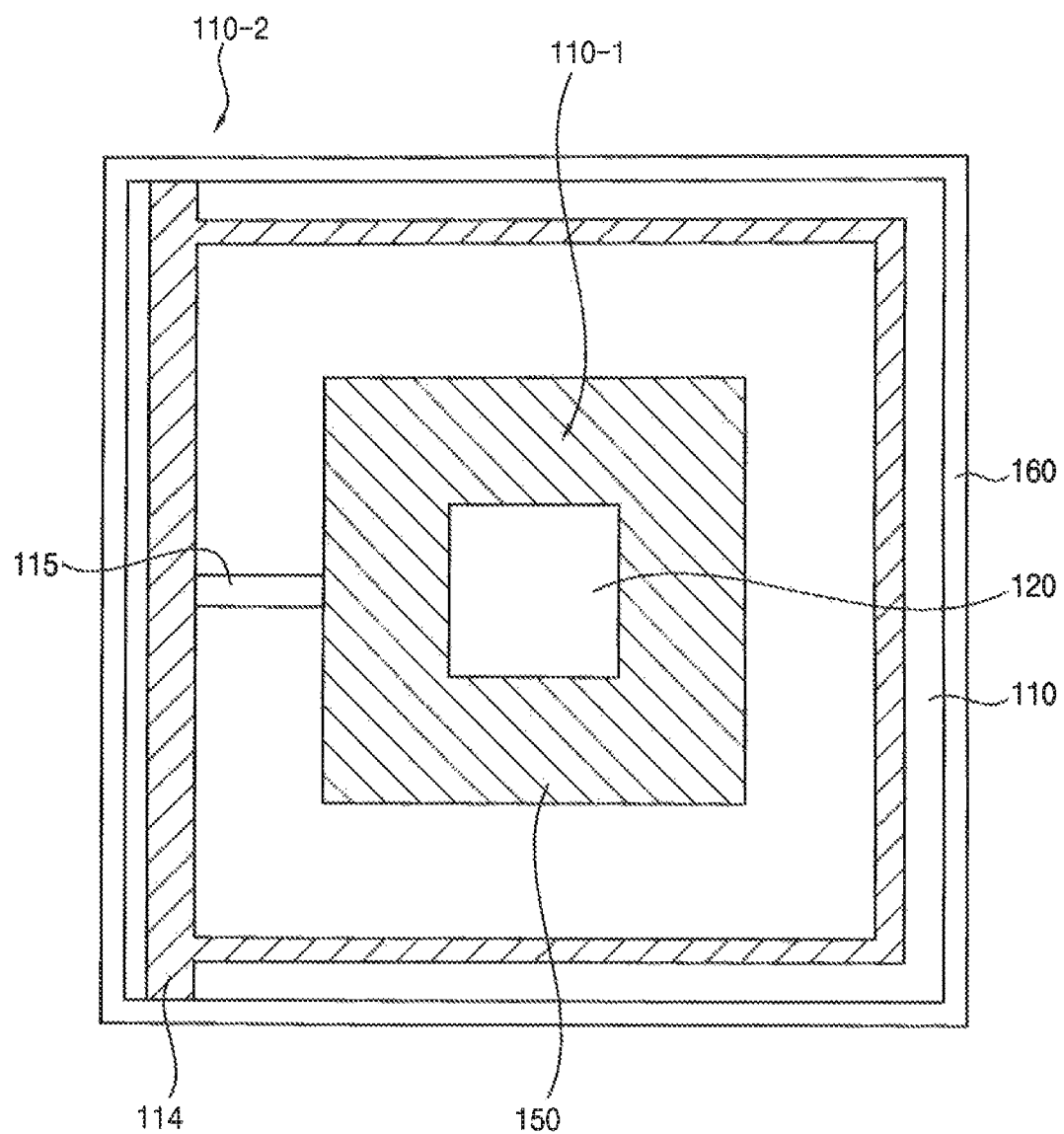
FIG. 2 is a plan view illustrating the semiconductor package of FIG. 1.

FIG. 1 is a cross-sectional view illustrating a semiconductor package in accordance with an exemplary embodiment, and FIG. 2 is a plan view illustrating the semiconductor package of FIG. 1.

Referring to FIGS. 1 and 2, a semiconductor package 100 includes a package substrate 110, a semiconductor chip 120, conductive connecting members 130, a molding member 140, an EMI shielding layer 150, an EMI shielding can 160 and external terminals 170.

The package substrate 110 includes a central portion 110-1 and a peripheral portion 110-2. The package substrate 110 includes an upper pad 111, a lower pad 112, a conductive line 113 and a ground line 114. The upper pad 111 is arranged on an edge portion of an upper surface of the peripheral region 110-2 in the package substrate 110. The lower pad 112 is arranged on an edge portion of a lower surface of the peripheral portion 110-2 in the package substrate 110. The conductive line 113 electrically connects the upper pad 111 and the lower pad 112. The ground line 114 is formed in the package substrate 110. The ground line 114 may have various shapes. The ground line 114 may be electrically connected to the upper pad 111 and/or the lower pad 112.

The central portion 110-1 of the package substrate 110 includes a protrusion 116 protruded from the upper surface of the peripheral portion 110-2. For example, the protrusion 116 is positioned on a level higher that a level of the peripheral portion 110-2 of the package substrate 110. Thus, the protrusion 116 includes a receiving groove 117. For example, the receiving groove 117 having an opened lower surface is formed at a lower portion of the central portion 110-1 in the package substrate 110 by a step between the protrusion 116 and the peripheral portion 110-2. The protrusion 116 includes side surfaces slantly upwardly extended from the peripheral portion 110-2 of the package substrate 110, an upper surface connected between upper ends of the side surfaces, and a lower surface connected to lower ends of the side surfaces. Alternatively, the protrusion 116 may have side surfaces vertically upwardly extended from the peripheral portion 110-2 of the package substrate 110.

The package substrate 110 may include a flexible substrate. The protrusion 116 may be formed at the central portion 110-1 of the package substrate 110 by upwardly pressing the central portion 110-1 of the flexible package substrate 110. For example, the package substrate 110 may include a flexible material such as polyimide. The present inventive concept is not limited thereto, and the package substrate 110 may include other flexible materials. Alternatively, the package substrate 110 may include a stiff material.

The semiconductor chip 120 is arranged on an upper surface of the protrusion 116 in the package substrate 110. The semiconductor chip 120 is smaller than the upper surface of the protrusion 116. In an exemplary embodiment, the semiconductor chip 120 may be substantially equal to the upper surface of the protrusion 116 in size. Thus, the receiving groove 117 is greater than the semiconductor chip 120. For example, the semiconductor chip 120 is not extended beyond the perimeter of the upper surface in the package substrate 110. The receiving groove 117 is positioned under the upper surface of the package substrate 110. The semiconductor chip 120 includes bonding pads 122. The bonding pads 122 are arranged on an edge portion of an upper surface of the semiconductor chip 120.

The conductive connecting members 130 electrically connect the semiconductor chip 120 and the package substrate 110. In example embodiments, the conductive connecting members 130 may include conductive wires. The conductive connecting members 130 are electrically connected between the bonding pads 122 of the semiconductor chip 120 and the upper pad 111 of the package substrate 110. Thus, each of the conductive connecting members 130 may include an upper end connected to the bonding pad 122, and a lower end connected to the upper pad 111.

The molding member 140 is formed on the upper surface of the package substrate 110 to cover the semiconductor chip 120. The molding member 140 serves to protect the semiconductor chip 120 and the conductive connecting members 130 from external environments. The molding member 140 may include an epoxy molding compound (EMC).

The EMI shielding layer 150 is formed in the receiving groove 117 of the package substrate 110. The EMI shielding layer 150 is positioned in the receiving groove 117 only. The EMI shielding layer 150 may shield EMI propagated from a lower surface of the semiconductor chip 120 through the protrusion 16. The EMI propagated through the central portion 110-1 of the package substrate on which the semiconductor chip 120 is mounted among EMIs generated from the semiconductor chip 120 may be shielded. The EMI generated from the lower surface of the semiconductor chip 120 may have a low frequency. Thus, the EMI shielding layer 150 may shield the EMI having the low frequency propagated from the lower surface of the semiconductor chip 120 toward the central portion 110-1 of the package substrate 110. Further, the EMI shielding layer 150 may also shield an EMI having a high frequency as well as the EMI having the low frequency. The EMI shielding layer 150 may include an alloy of nickel and iron, an alloy of copper and nickel, silver, etc. When the semiconductor chip 120 may include a magnetic random access memory (MRAM) chip, the EMI shielding layer 150 may include Permalloy that may be one kind of the alloys of nickel and iron.

Because the EMI shielding layer 150 is positioned in the receiving groove 117, the EMI shielding layer 150 has a width substantially the same as the width of the receiving groove 117. Thus, the width of the EMI shielding layer 150 is greater than the width of the semiconductor chip 120. Thus, because the width of the EMI shielding layer 150 is greater than the width of the semiconductor chip 120, the EMI shielding layer 150 may shield the EMI propagated from the lower surface of the semiconductor chip 120 toward the central portion 110-1 of the package substrate 110.

The EMI shielding layer 150 includes a lower surface substantially coplanar with the lower surface of the peripheral portion 110-2 of the package substrate 110. A mobile device may have a package-on-package (POP) structure including sequentially stacked semiconductor chips. Thus, another semiconductor package may be arranged under the semiconductor package 100. When the lower surface of the EMI shielding layer 150 may be protruded from the lower surface of the peripheral portion 110-2 of the package substrate 110, a thickness of the POP structure may be increased. To prevent the thickness increase of the POP structure, the lower surface of the EMI shielding layer 150 is substantially coplanar with the lower surface of the peripheral portion 110-2 of the package substrate 110.

To increase shielding efficiency of the EMI shielding layer 150, the EMI shielding layer 150 is electrically connected to the ground line 114. For example, the EMI shielding layer 150 is electrically connected to the ground line 114 through a connecting line 115.

The EMI shielding can 160 surrounds side surfaces and an upper surface of the molding member 140, and side surfaces of the package substrate 110. The EMI shielding can 160 may serve to shield EMI propagated through the side surfaces and the upper surface of the semiconductor chip 120. Because the EMI propagated through the side surfaces and the upper surface of the semiconductor chip 120 may have a high frequency, the EMI shielding can 160 may shield the EMI having the high frequency. Further, the EMI shielding can 160 may also shield an EMI having a low frequency as well as the EMI having the high frequency propagated through the side surfaces and the upper surface of the semiconductor chip 120. The EMI shielding can 160 may include a material substantially the same as the material of the EMI shielding layer 150. Thus, the EMI shielding can 160 may include an alloy of nickel and iron, an alloy of copper and nickel, silver, etc. Further, to increase shielding efficiency of the EMI shielding can 160, the EMI shielding can 160 is electrically connected to the ground line 114.

The external terminals 170 are electrically connected to the lower pad 112 of the package substrate 110. The external terminals 170 may include solder balls.

In example embodiments, the semiconductor package 100 includes a single semiconductor chip of the single semiconductor chip 120. The inventive concept is not limited thereto. For example, the semiconductor package 100 may include two or more semiconductor chips.

FIGS. 3 to 6 are cross-sectional views illustrating a method of manufacturing the semiconductor package of FIG. 1.

Figure 3:
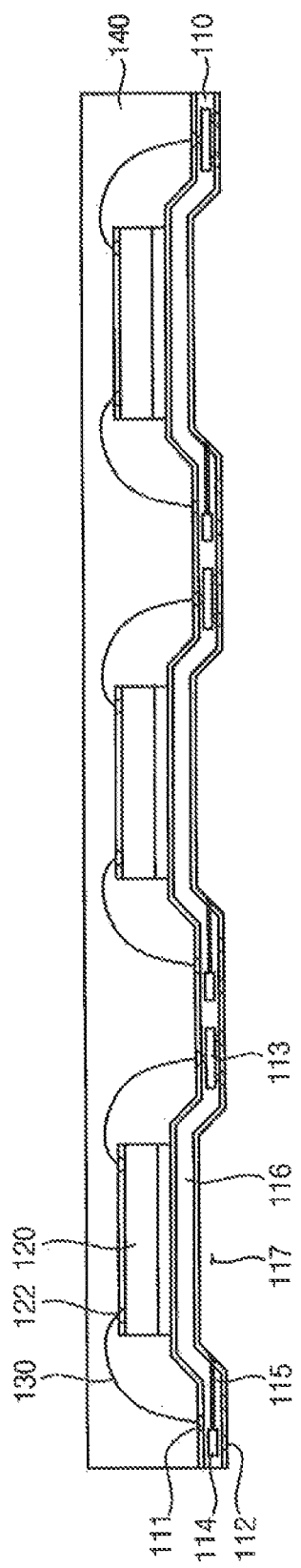
FIGS. 3 to 6 are cross-sectional views illustrating a method of manufacturing a semiconductor package in accordance with an exemplary embodiment of the present inventive concept.

Referring to FIG. 3, the semiconductor chips 120 are arranged on the upper surface of the flexible package substrate 110. The conductive connecting members 130 such as the conductive wires are electrically connected between the upper pad 111 of the package substrate 110 and the bonding pads 122 of the semiconductor chips 120. The molding member 140 is formed on the upper surface of the package substrate 110 by a molding process to cover the semiconductor chips 120.

The protrusion 116 may be formed in the molding process by pressing the lower surface of the package substrate 110. Thus, the receiving grooves 117 are formed at the central portions 110-1 of the package substrate 110. The receiving grooves 117 may be positioned under the semiconductor chips 120.

Figure 4:
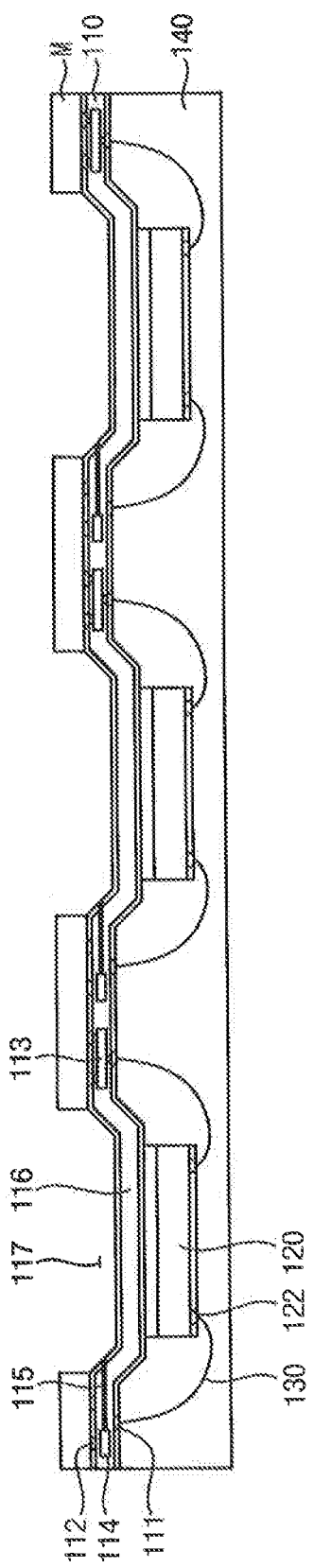

Referring to FIG. 4, a stencil mask M is formed on an upside-down structure of FIG. 3. The receiving groove 117 is upwardly exposed. The stencil mask M includes an opening which exposes the receiving groove 117.

Figure 5:
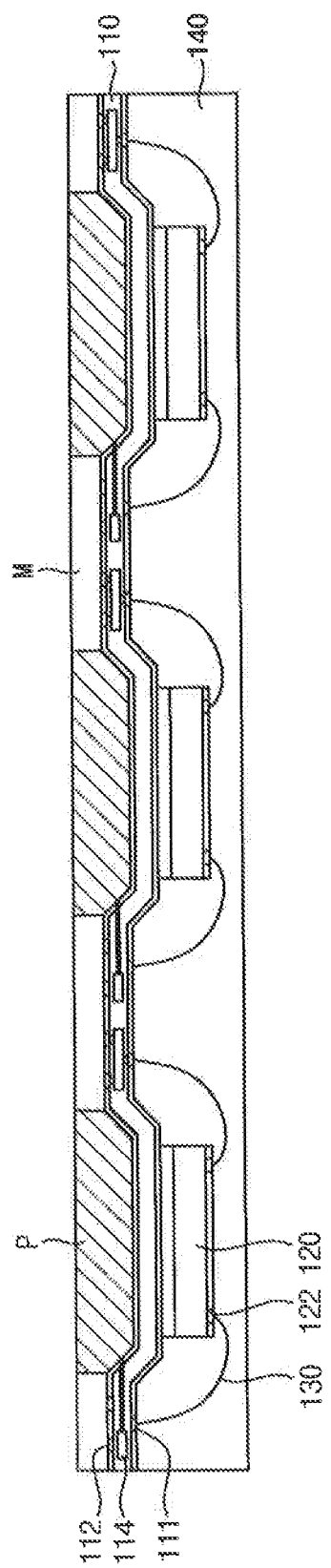

Referring to FIG. 5, a metal paste P is formed using the stencil mask M. The metal paste P fills the receiving grooves 117. The metal paste P may include a material for shielding EMI. The metal paste P may include an alloy of nickel and iron, an alloy of copper and nickel, silver, etc. The metal paste P may include Permalloy.

Figure 6:
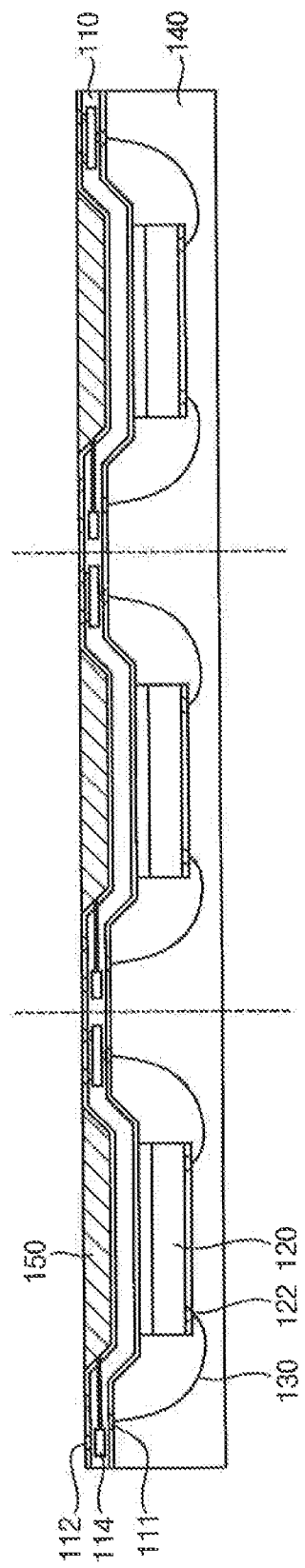

Referring to FIG. 6, the metal paste P and the stencil mask M are removed until the lower surface of the package substrate 110 is exposed. The remaining portions of the metal paste P in the receiving grooves 117 are separated from each other, and such remaining portions correspond to an EMI shielding layer 150. The metal paste P and the stencil mask M may be removed using a chemical mechanical polishing (CMP) process and/or an etching process. The EMI shielding layer 150 is confined in the receiving groove 117.

The package substrate 110 may be cut along scribe lanes of the package substrate 110 to singulate preliminary semiconductor packages. For example, the package substrate 110 may be cut along the dashed lines on FIG. 6, and each singulated preliminary semiconductor package is subject to forming of an EMI shielding can 160.

Referring back to FIG. 1, the EMI shielding can 160 is formed on the preliminary semiconductor package to cover the side surfaces and the upper surface of the molding member 140 and the side surfaces of the package substrate 110. The external terminals 170 may be electrically connected to the lower pad 112 of the package substrate 110 to complete the semiconductor package 100 of FIG. 1.

Alternatively, before cutting the package substrate 110, the external terminals 170 may be electrically connected to the lower pad 112 of the package substrate 110.

According to an exemplary embodiment, the EMI shielding layer 150 is positioned in the receiving groove 117 under the semiconductor chip 120, and thus the EMI shielding layer 150 may serve to shield the EMI propagated from the lower surface of the semiconductor chip 120 through the central portion 110-1 of the package substrate 110. According to an exemplary embodiment, the EMI shielding layer 150 may be formed using a printing process. Thus, the EMI between the semiconductor package and an adjacent electronic device may be suppressed. As a result, the incorporation of the semiconductor package into an electronic device may increase operational reliability thereof. The electronic device may include a mobile electronic device including a smart phone, a tablet or a wearable electronic device.

Figure 7:
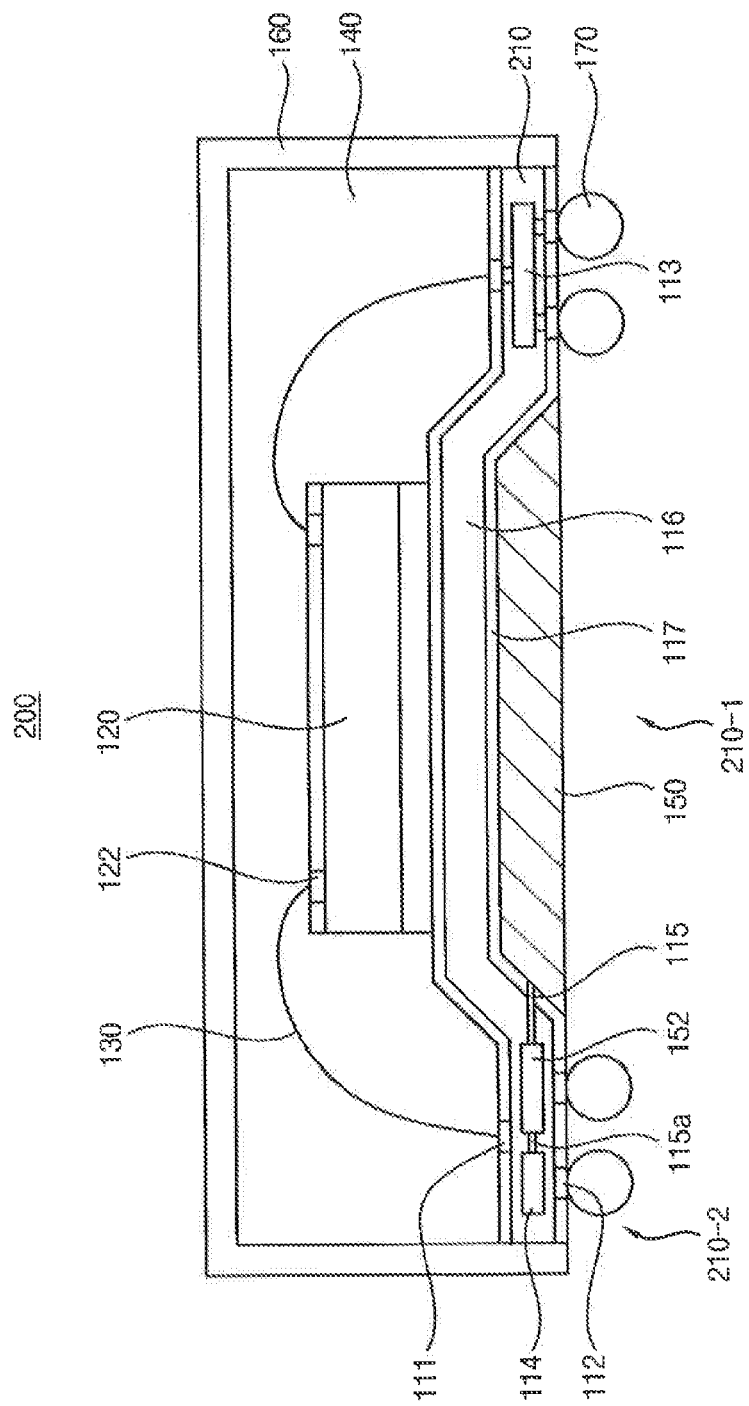
FIG. 7 is a cross-sectional view illustrating a semiconductor package in accordance with an exemplary embodiment of the present inventive concept.
Figure 8:
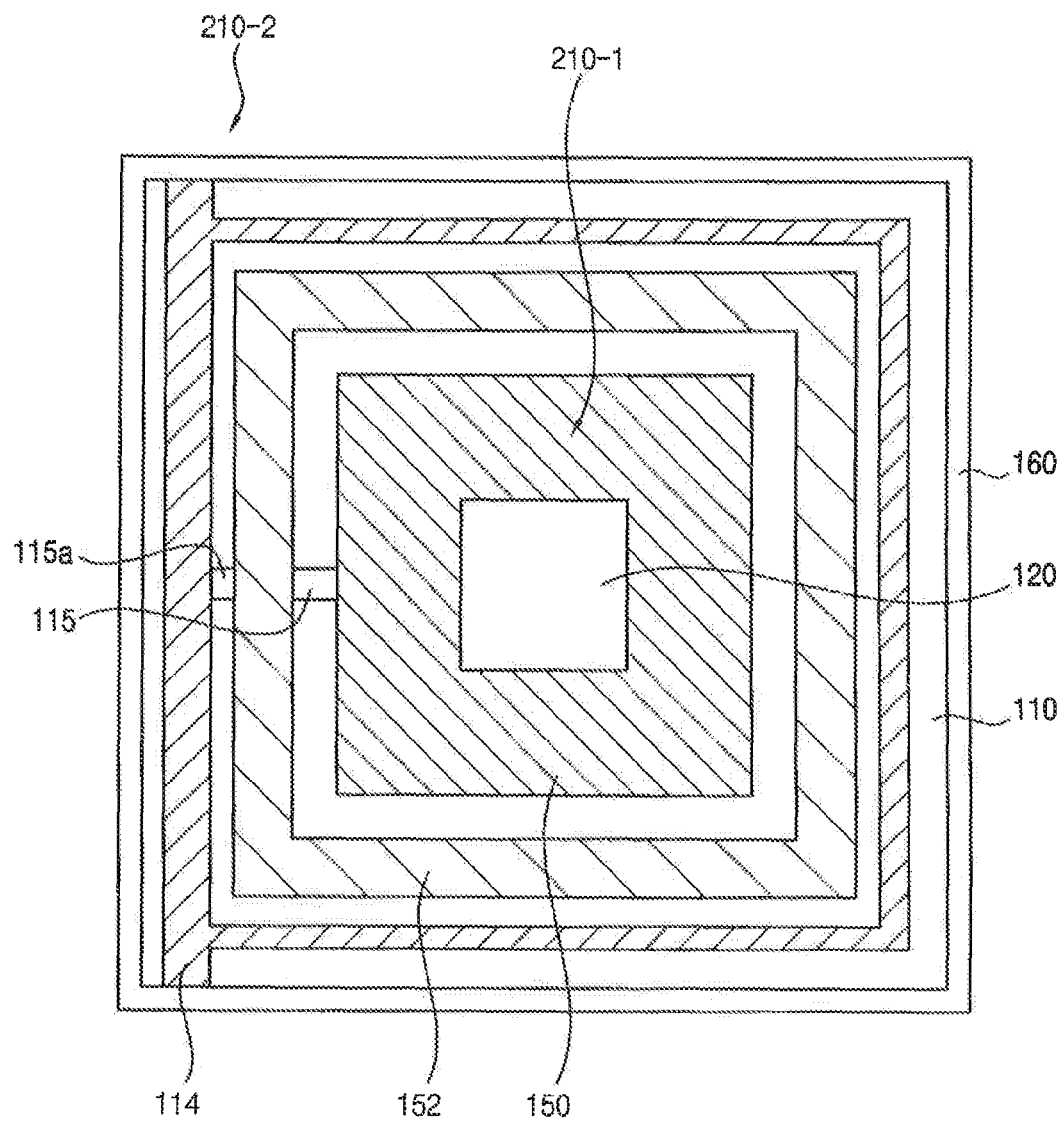
FIG. 8 is a plan view illustrating the semiconductor package of FIG. 7.

FIG. 7 is a cross-sectional view illustrating a semiconductor package in accordance with an exemplary embodiment, and FIG. 8 is a plan view illustrating the semiconductor package of FIG. 7.

A semiconductor package 200 includes elements substantially the same as those of the semiconductor package 100 of FIG. 1 except that the semiconductor package 200 further includes an auxiliary EMI shielding layer 152. Thus, the same reference numerals may refer to the same elements and any further illustrations with respect to the same elements may be omitted herein for brevity.

Referring to FIGS. 7 and 8, the auxiliary EMI shielding layer 152 is arranged in a peripheral portion 210-2 of a package substrate 210. The auxiliary EMI shielding layer 152 is positioned between the EMI shielding layer 150 and the ground line 114. The auxiliary EMI shielding layer 152, having a linear loop shape, surrounds the EMI shielding layer 150. The present inventive concept is not limited thereto, and the auxiliary EMI shielding layer 152 may have other shapes.

The EMI shielding layer 150 may serve to shield the EMI propagated through a central portion 210-1 of the package substrate 210. The auxiliary EMI shielding layer 152 may serve to shield EMI propagated through the peripheral portion 210-2 of the package substrate 210. The auxiliary EMI shielding hayed 52 may include a material substantially the same as the material of the EMI shielding layer 150. Thus, the auxiliary EMI shielding can 152 may include an alloy of nickel and iron, an alloy of copper and nickel, silver, etc.

The auxiliary EMI shielding layer 152 is electrically connected to the EMI shielding layer 150 through the connecting line 115. The auxiliary EMI shielding layer 152 is electrically connected to the ground line 114 through an auxiliary connecting line 115a. Thus, the EMI shielding layer 150 is connected to the ground line 114 through the connecting line 115, the auxiliary EMI shielding layer 152 and the auxiliary connecting line 115a.

A method of manufacturing the semiconductor package 200 may include processes substantially the same as the processes illustrated with reference to FIGS. 3 to 6 except for further including a process for forming the auxiliary EMI shielding layer 152 in the peripheral region 210-2 of the package substrate 210. Thus, the method of manufacturing the semiconductor package 200 may be omitted herein for brevity.

According to an exemplary embodiment, the auxiliary EMI shielding layer 152 is further positioned in the peripheral portion 210-2 of the package substrate 210. The EMI shielding layer 150 may serve to shield the EMI propagated through the central portion 210-1 of the package substrate 210. The auxiliary EMI shielding layer 152 may serve to shield the EMI propagated through the peripheral portion 210-2 of the package substrate 210. Thus, the disturbance between the semiconductor package and an adjacent electronic device due to EMI may be suppressed. As a result, the electronic device such as a mobile electronic device including the semiconductor package may have operational reliability.

Figure 9:
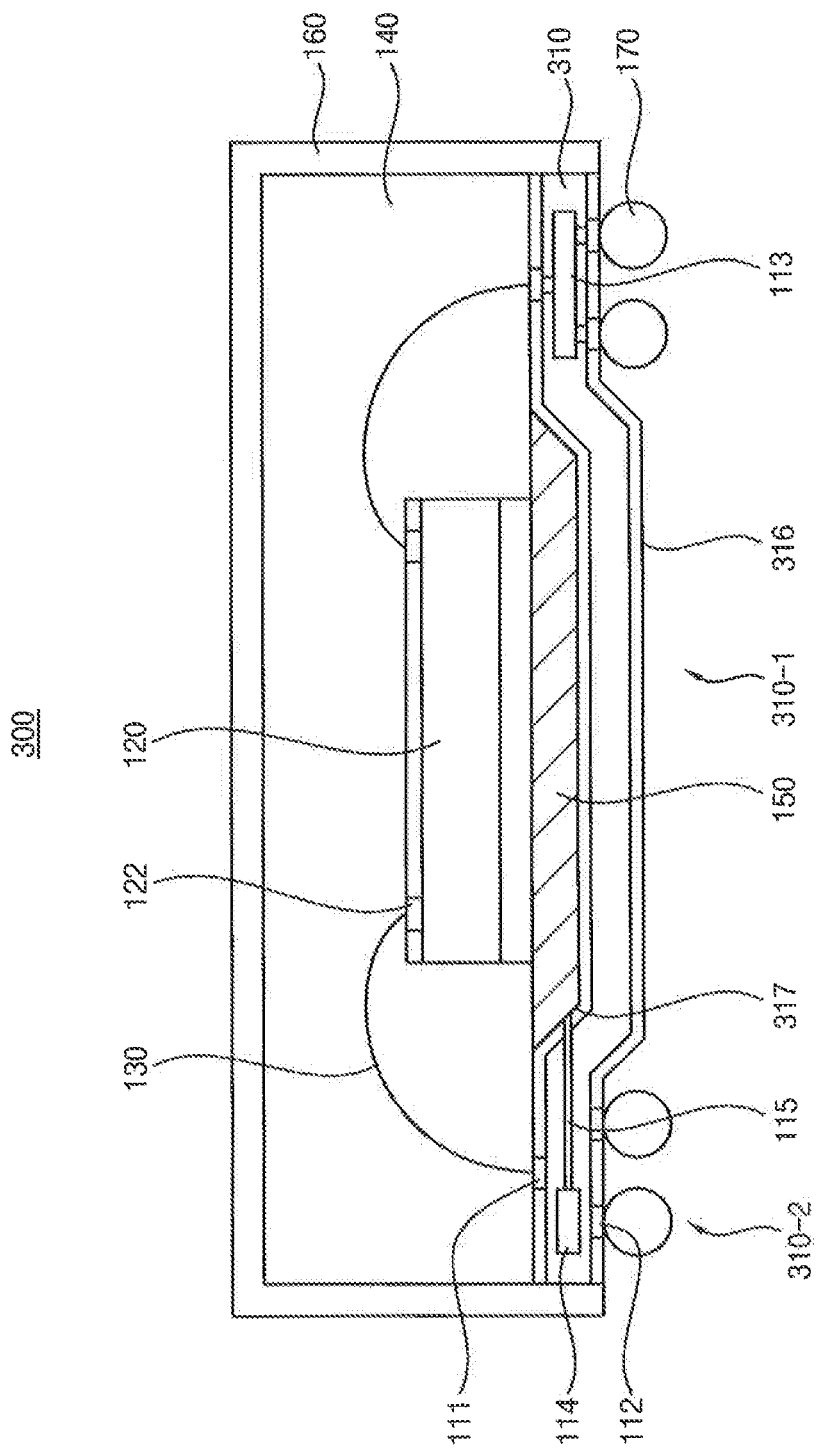
FIG. 9 is a cross-sectional view illustrating a semiconductor package in accordance with an exemplary embodiment of the present inventive concept.

FIG. 9 is a cross-sectional view illustrating a semiconductor package in accordance with an exemplary embodiment of the present inventive concept.

A semiconductor package 300 includes elements substantially the same as those of the semiconductor package 100 in FIG. 1 except for a package substrate 310. Thus, the same reference numerals may refer to the same elements and any further illustrations with respect to the same elements may be omitted herein for brevity.

Referring to FIG. 9, a protrusion 316 is downwardly formed from a central portion 310-1 of the package substrate 310. Thus, a receiving groove 317 having an opened upper surface is formed at the central portion 310-1 of the package substrate 310. The EMI shielding layer 150 includes an island shape positioned in the receiving groove 317. To reduce a thickness of a POP structure, the protrusion 316 may have a lower surface higher than lower ends of the external terminals 170.

The EMI shielding layer 150 is arranged in the receiving groove 317. The EMI shielding layer 150 includes an upper surface substantially coplanar with an upper surface of a peripheral portion 310-2 of the package substrate 310. Thus, the EMI shielding layer 150 need not increase the thickness of the semiconductor package 300.

Additionally, the semiconductor package 300 may further include an auxiliary EMI shielding layer as shown in FIG. 7.

FIGS. 10 to 14 are cross-sectional views illustrating a method of manufacturing the semiconductor package of FIG. 9.

Figure 10:
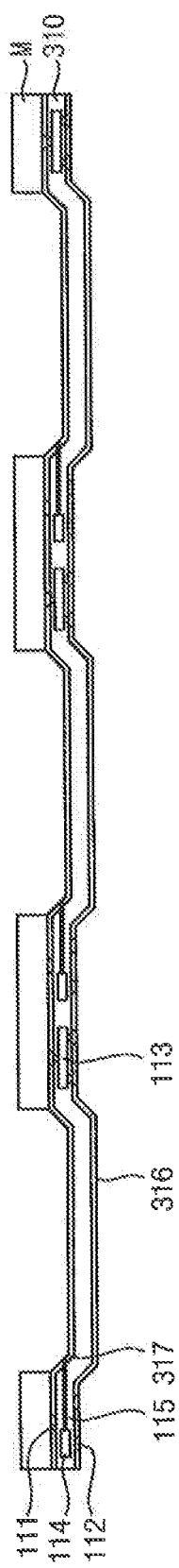
FIGS. 10 to 14 are cross-sectional views illustrating a method of manufacturing the semiconductor package in FIG. 9.

Referring to FIG. 10, the protrusion 316 may be formed in a molding process where the upper surface of the package substrate 310 is pressed. The receiving groove 317 has the opened upper surface. A stencil mask M is arranged on the upper surface of the package substrate 310.

Figure 11:
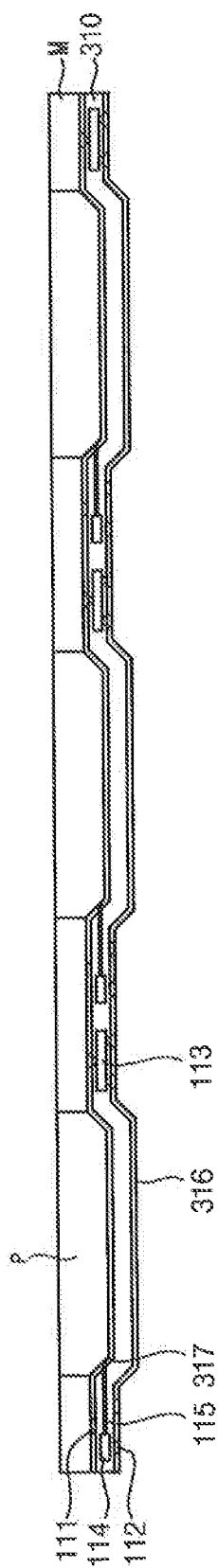

Referring to FIG. 11, a metal paste P is printed using the stencil mask M. The metal paste P fills the receiving grooves 117. The metal paste P may include a material for shielding the EMI. The metal paste P may include an alloy of nickel and iron, an alloy of copper and nickel, silver, etc. The metal paste P may include Permalloy.

Figure 12:
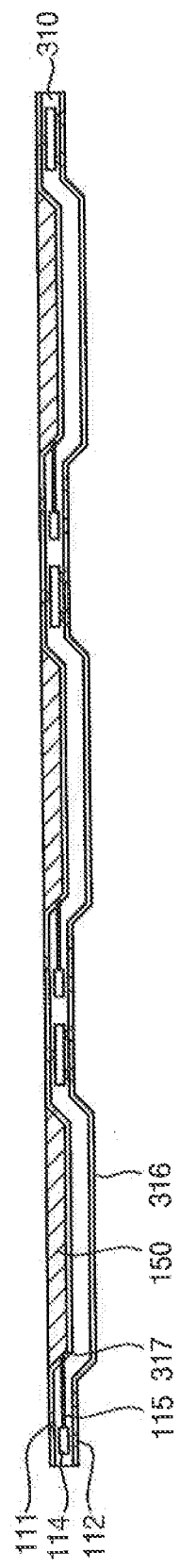

Referring to FIG. 12, the EMI shielding layer 150 is formed using a planarization process including a CMP process and/or an etching process, for example. For example, the metal paste P and the stencil mask M may be removed until the upper surface of the package substrate 310 may be exposed to form the EMI shielding layer 150. The EMI shielding layer 150 includes an island shape positioned in the receiving groove 317.

Figure 13:
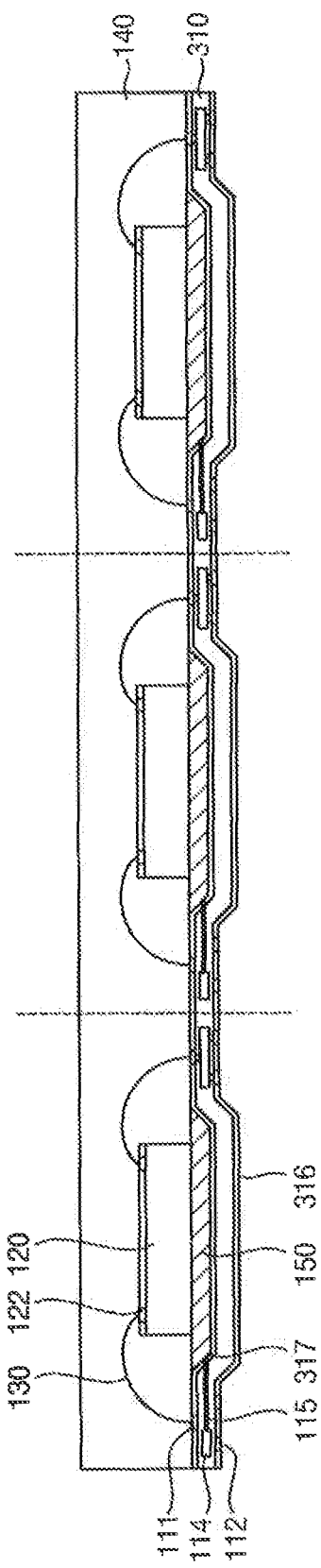

Referring to FIG. 13, the semiconductor chips 120 are arranged on the central portions 310-1 of the package substrate 310. The conductive connecting members 130 such as the conductive wires may are electrically connected between the upper pad 111 in the peripheral portion 310-2 of the package substrate 310 and the bonding pads 122 of the semiconductor chip 120. The molding member 140 is formed on the package substrate 310 to cover the semiconductor chip 120.

The package substrate 310 may be cut along scribe lanes of the package substrate 310 to singulate the semiconductor packages 300. For example, the package substrate 310 may be cut along the dashed lines as shown in FIG. 13.

Figure 14:
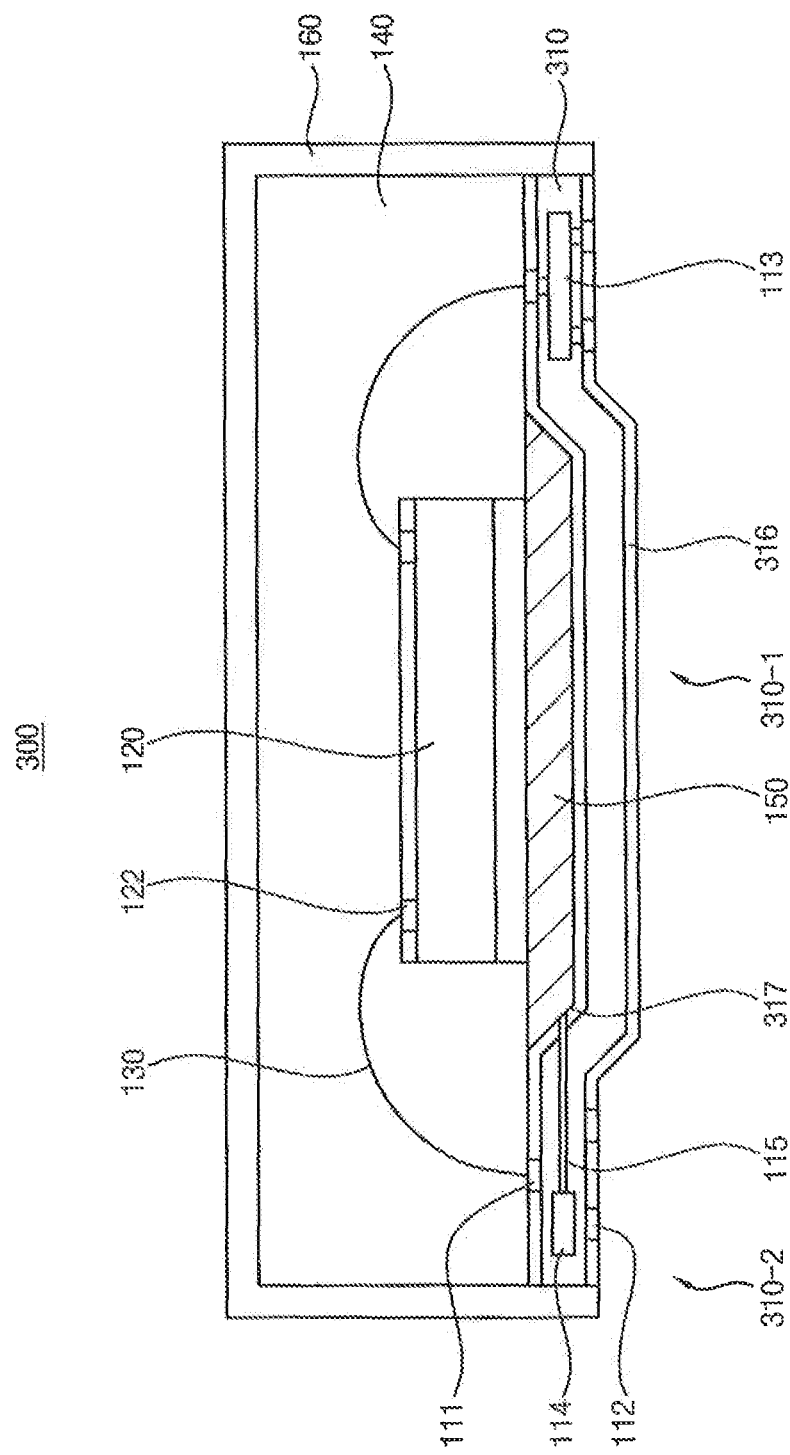

Referring to FIG. 14, the EMI shielding can 160 may cover the side surfaces and the upper surface of the molding member 140 and the side surfaces of the package substrate 310.

Referring back to FIG. 9, the external terminals 170 are electrically connected to the lower pad 112 of the package substrate 110 to complete the semiconductor package 300 of FIG. 9. Alternatively, before cutting the package substrate 310, the external terminals 170 may be electrically connected to the lower pad 112 in the peripheral portion 310-2 of the package substrate 310.

Figure 15:
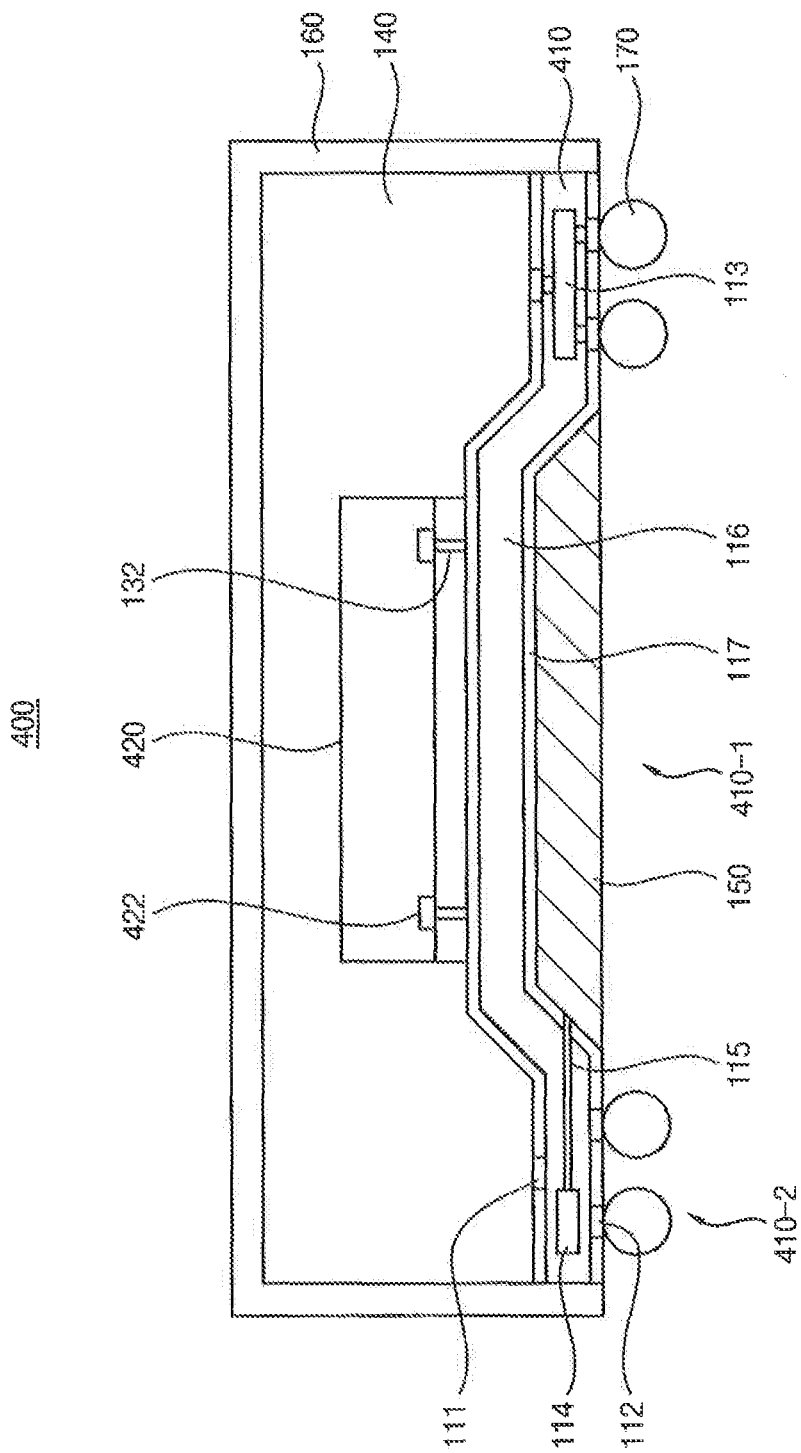
FIG. 15 is a cross-sectional view illustrating a semiconductor package in accordance with an exemplary embodiment of the present inventive concept.

FIG. 15 is a cross-sectional view illustrating a semiconductor package in accordance with an exemplary embodiment of the present inventive concept.

A semiconductor package 400 includes elements substantially the same as those of the semiconductor package 100 in FIG. 1 except for a semiconductor chip 420. Thus, the same reference numerals may refer to the same elements and any further illustrations with respect to the same elements may be omitted herein for brevity.

Referring to FIG. 15, bonding pads 422 are arranged on an edge portion of a lower surface of the semiconductor chip 420. The upper pad 111 is arranged on the upper surface of the protrusion 116. Conductive connecting members 132 are interposed between the bonding pads 422 and the upper pad 111 to electrically connect the semiconductor chip 420 to the package substrate 410. The conductive connecting members 132 may include conductive bumps.

Alternatively, the semiconductor package 400 may include the structure of the FIG. 7 or the structure of FIG. 9.

A method of manufacturing the semiconductor package 400 may include processes substantially the same as the processes illustrated with reference to FIGS. 3 to 6 except for a process for electrically connecting the semiconductor chip 420 with the package substrate 410 using the conductive bumps 132. Thus, the method of manufacturing the semiconductor package 400 may be omitted herein for brevity.

Figure 16:
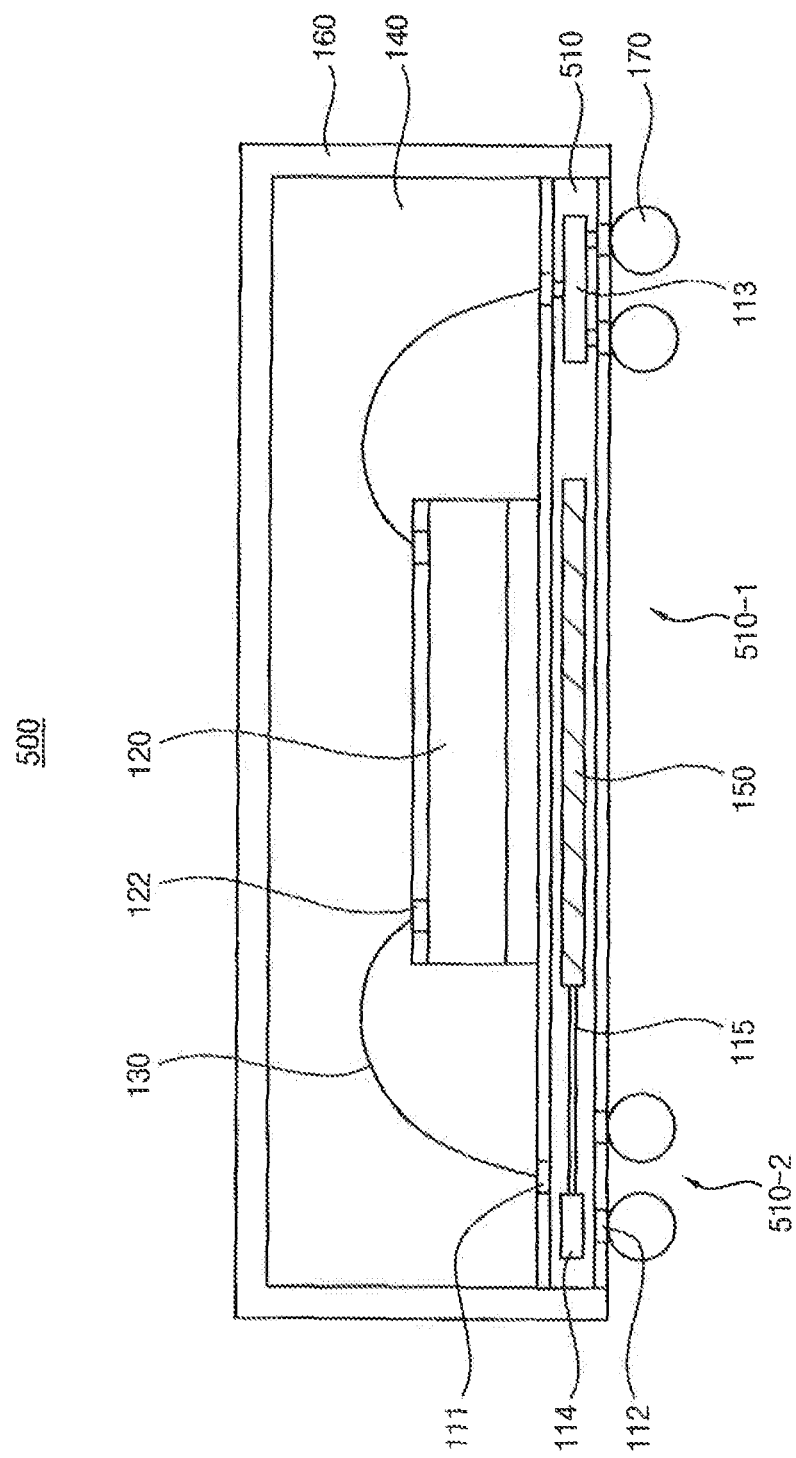
FIG. 16 is a cross-sectional view illustrating a semiconductor package in accordance with an exemplary embodiment of the present inventive concept.

FIG. 16 is a cross-sectional view illustrating a semiconductor package in accordance with an exemplary embodiment of the present inventive concept.

A semiconductor package 500 includes elements substantially the same as those of the semiconductor package 100 in FIG. 1 except for a package substrate. Thus, the same reference numerals may refer to the same elements and any further illustrations with respect to the same elements may be omitted herein for brevity.

Referring to FIG. 16, a package substrate 510 does not include a protrusion and a receiving groove. The EMI shielding layer 150 may be arranged in a central portion 510-1 of the package substrate 510. The package substrate 510 may include a multi-layered substrate including a plurality of insulating layers. Thus, the EMI shielding layer 150 is formed in the central portion 510-1 of the package substrate 510 by forming metal layers between the insulating layers. The EMI shielding layer 150 is electrically connected to the ground line 114 through the connecting line 115.

Alternatively, the semiconductor package 500 may include the structure of the FIG. 7 or the structure of FIG. 9.

Figure 17:
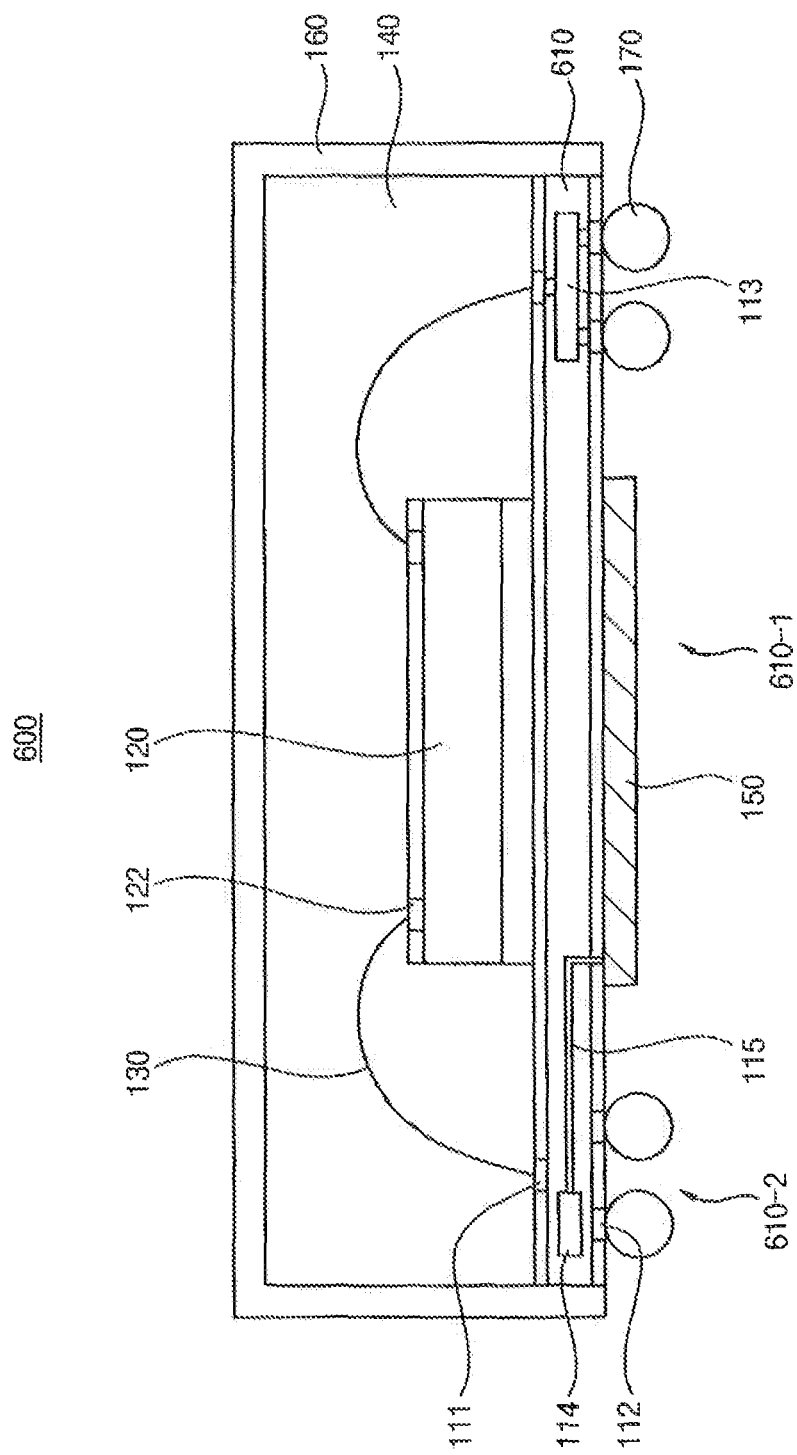
FIG. 17 is a cross-sectional view illustrating a semiconductor package in accordance with an exemplary embodiment of the present inventive concept.

FIG. 17 is a cross-sectional view illustrating a semiconductor package in accordance with an exemplary embodiment of the present inventive concept.

A semiconductor package 600 includes elements substantially the same as those of the semiconductor package 100 in FIG. 1 except for a package substrate. Thus, the same reference numerals may refer to the same elements and any further illustrations with respect to the same elements may be omitted herein for brevity.

Referring to FIG. 17, a package substrate 610 does not include a protrusion and a receiving groove. The EMI shielding layer 150 is arranged on a lower surface of a central portion 610-1 of the package substrate 610. Thus, the EMI shielding layer 150 is overlapped with the semiconductor chip 120. The Emi shielding layer 150 may have an island shape. The EMI shielding layer 150 is electrically connected to the ground line 114 through the connecting line 115. Alternatively, the EMI shielding layer 150 may be electrically connected to the ground line 115 through a conductive wire.

Alternatively, the semiconductor package 500 may include the structure of the FIG. 7 or the structure of FIG. 9.

According to an exemplary embodiment, the EMI shielding layer is positioned under the semiconductor chip so that the EMI propagated from the lower surface of the semiconductor chip may be shielded. Thus, the EMI between the semiconductor package and an adjacent electronic device may be suppressed. As a result, the electronic device such as a mobile electronic device including the semiconductor package may have operational reliability.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor package comprising:
   a semiconductor chip;
   a package substrate arranged under the semiconductor chip and electrically connected to the semiconductor chip, the package substrate having a receiving groove; and
   an electromagnetic interference (EMI) shielding layer arranged in the receiving groove to shield EMI propagated from a lower surface of the semiconductor chip through the package substrate,
   wherein the package substrate comprises a central portion and a peripheral portion, and the central portion is upwardly protruded from the peripheral portion to form the receiving groove.

2. The semiconductor package of claim 1, wherein the EMI shielding layer has a lower surface substantially coplanar with a lower surface of the peripheral portion of the package substrate.

3. The semiconductor package of claim 1, wherein the EMI shielding layer has an upper surface substantially coplanar with an upper surface of the peripheral portion of the package substrate.

4. The semiconductor package of claim 1,
   wherein the package substrate further comprises a ground line which is electrically connected to the EMI shielding layer.

5. The semiconductor package of claim 4,
   wherein the package substrate further comprises an auxiliary EMI shielding layer through which the EMI shielding layer is connected to the ground line.

6. The semiconductor package of claim 1, further comprising an EMI shielding can covering the package substrate and the semiconductor chip to shield EMI propagated from an upper surface and side surfaces of the semiconductor chip.

7. The semiconductor package of claim 6,
   wherein the package substrate further comprises a ground line, and
   wherein the EMI shielding can is electrically connected to the ground line.

8. The semiconductor package of claim 1,
   wherein the package substrate comprises a flexible substrate.

9. The semiconductor package of claim 1,
   wherein the EMI shielding layer comprises an alloy of nickel and iron, an alloy of copper and nickel or silver.

10. A semiconductor package comprising:
    a semiconductor chip;
    a package substrate arranged under the semiconductor chip and electrically connected to the semiconductor chip, the package substrate having a protrusion protruded toward the semiconductor chip to form a receiving groove;
    an EMI shielding can covering the package substrate and the semiconductor chip to shield EMI propagated from an upper surface and side surfaces of the semiconductor chip; and
    an EMI shielding layer arranged in the receiving groove to shield EMI propagated from a lower surface of the semiconductor chip through the package substrate.

11. The semiconductor package of claim 10,
    wherein the package substrate further comprises a ground line which is connected to the EMI shielding layer and the EMI shielding can.

12. The semiconductor package of claim 11,
    wherein the protrusion is positioned in a central portion of the package substrate, and
    wherein the EMI shielding layer comprises a lower surface substantially coplanar with a lower surface of the peripheral portion of the package substrate.

13. The semiconductor package of claim 12, further comprising an auxiliary EMI shielding layer arranged in a peripheral portion of the package substrate to electrically connect the EMI shielding layer and the ground line.

* * * * *